United States Patent [19]

Kittl

[11] 3,751,303

[45] Aug. 7, 1973

[54] ENERGY CONVERSION SYSTEM

[75] Inventor: Emil Kittl, Locust, N.J.

[73] Assignee: The United States of America as represented by the Secretary of the Army, Washington, D.C.

[22] Filed: June 3, 1971

[21] Appl. No.: 149,419

[52] U.S. Cl. .................................... 136/89, 250/85
[51] Int. Cl. .................................... H01l 15/02
[58] Field of Search .......................... 136/89; 250/85

[56] References Cited

UNITED STATES PATENTS

| | | | |
|---|---|---|---|
| 3,076,861 | 2/1963 | Samulson et al. | 136/89 |
| 3,591,420 | 7/1971 | Streed | 136/89 |
| 3,031,519 | 4/1962 | Silverman | 136/89 |
| 3,094,634 | 6/1963 | Rappaport | 136/89 X |
| 3,497,392 | 2/1970 | Walker | 136/89 |
| 2,876,361 | 3/1959 | Hutchinson | 136/89 UX |
| 3,536,919 | 10/1970 | Newman | 250/85 |
| 3,585,390 | 6/1971 | Ishikawa | 250/84 |

FOREIGN PATENTS OR APPLICATIONS

| | | | |
|---|---|---|---|
| 615,938 | 3/1961 | Canada | 136/89 |

*Primary Examiner*—Allen B. Curtis
*Attorney*—Harry M. Saragovitz, Edward J. Kelly, Herbert Berl and Roy E. Gordon

[57] ABSTRACT

An energy conversion system is provided for converting thermal radiation energy into electricity. The system includes a source of thermal energy and a silicon cell spaced from the thermal energy source. A radiating solid material is positioned between and spaced from the thermal energy source and the silicon cell. The radiating solid material is capable of radiating a major portion of the heat received from the thermal energy source in the spectral band where the silicon cell shows its maximum spectral response. An interference filter is positioned between the radiating solid material and the silicon cell. The interference filter has its maximum reflectivity in the strongest emission band regions of the radiating solid material which are outside the maximum spectral response band of the silicon cell. The interference filter also has its highest transmission in the wavelength region where the silicon cell has good spectral response.

This invention relates to an energy conversion system for converting thermal radiation energy to useful electrical energy.

11 Claims, 1 Drawing Figure

PATENTED AUG 7 1973 3,751,303
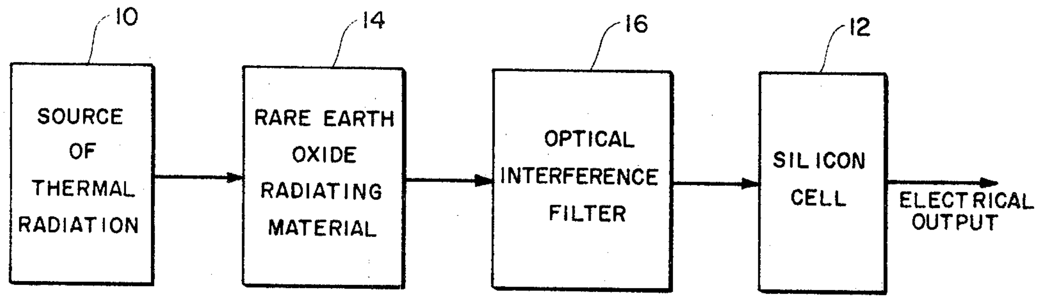
INVENTOR.
EMIL KITTL
BY: Roy E. Gordon AGENT
Harry M. Saragovitz, Edward J. Kelly & Herbert Berl
ATTORNEYS.

ENERGY CONVERSION SYSTEM

BACKGROUND OF THE INVENTION

Devices and/or systems have been described heretofore that use heat energy in the form of heat radiation and a photovoltaic solid state device such as a solar or silicon cell to convert the heat radiation to useful electrical energy. The problem with existing systems is that the photovoltaic device is only responsive or sensitive to a small region of the heat radiation spectrum. Heat radiation that falls on the device that is outside of the region of response of the device is lost.

SUMMARY OF THE INVENTION

The general object of this invention is to provide an energy conversion system to convert heat energy to useful electrical energy without the use of moving parts. A particular object of this invention is to provide such a system wherein the spectral energy distribution characteristic of the radiating heat source is matched to the spectral sensitivity characteristic of the photovoltaic device.

Such an energy conversion system has now been provided. The system includes a source of thermal energy such as the latent heat of combustion of common fossil fuels as gasoline. Spaced from the thermal energy source is a photovoltaic device such as a solar or silicon cell which is a desirable converter of radiant heat energy. A radiating solid material is positioned between and spaced from the thermal energy source and the photovoltaic device. The particular radiating solid material used is capable of radiating a major portion of the heat that it receives from the thermal energy source in the spectral band where the silicon cell shows its maximum spectral response. Particularly desirable radiating solid materials are rare earth oxides such as ytterbium oxide, erbium oxide, and thulium oxide. The system also includes an interference filter positioned between the radiating solid material and the silicon cell. The interference filter used must have its maximum reflectivity in the strongest emission band regions of the radiating solid material which are outside the maximum spectral response band of the silicon cell. The interference filter must also have its highest transmission in the wavelength range where the silicon cell has good spectral response.

BRIEF DESCRIPTION OF THE DRAWING AND THE PREFERRED EMBODIMENT

The invention can best be understood by referring to the drawing which is a schematic representation of the energy conversion system.

Referring to the Drawing, the energy conversion system includes a source of thermal energy 10 spaced from a suitable photovoltaic cell such as a silicon cell 12. A radiating solid material 14 is positioned between and spaced from the source of thermal energy 10 and the silicon cell 12. An interference filter 16 is positioned between the radiating solid material 14 and the silicon cell 12.

In the preferred embodiment, the source of thermal energy 10 can conveniently be a burner using a fossil fuel to heat the solid radiating material 14 to a temperature of approximately 1,600° C.

The radiating solid material 14 can conveniently be a pressed and sintered rare earth oxide powder such as ytterbium oxide, erbium oxide, or thulium oxide.

The interference filter 16 can either be applied directly to the surface of the silicon cell 12 or it can be placed in the optical path between the radiating solid material 14 and the silicon cell 12. As stated previously, the interference filter used has its maximum reflectivity in the strongest emission band regions of the radiating solid material which are outside the maximum spectral response band of the silicon cell and its highest transmission in the wavelength region where the silicon cell has good spectral response. An example of such an interference filter is the commercially available Solarkote filter model D-125354 as manufactured by "Spectrolab Inc." in Sylmar, California.

The particular interference filter used in the energy conversion system must have a high transmission of 90 to 95 percent in the wavelength range, 0.5 to 1.1 micrometers where the silicon cell has good spectral response. Similarly, the interference filter must have a maximum reflectivity of 50 to 90 percent in the region where the rare earth oxide radiating solid material has strong emission band regions; that is, in the wavelength regions from 1.2 to 1.7 micrometers. This radiation cannot be utilized by the silicon cell as it is beyond the 1.1 micrometers response limit. The filter reflects this unusable energy back to the rare earth oxide radiating solid material where it is reabsorbed. Thus, the energy is conserved in the system of the invention and results in an increase in spectral efficiency. In fact, with the system of the invention, a spectral efficiency of 40 percent is obtained in the instance where ytterbium oxide is the radiating solid material. Without an interference filter, the spectal efficiency using ytterbium oxide is only 14 percent. When erbium oxide is the radiating solid material, the spectral efficiency of the system is 32 percent as compared to 10 percent without a filter.

Various embodiments are contemplated for the energy conversion system of the invention. For example, the thermal energy source instead of being a fossil fuel burner, may be a solid propellant fuel burner or a radioisotope material. Then, too, the source of thermal energy or burner chamber may be combined with the radiating solid material as an integral unit. Advantage may also be gained by arranging the source of thermal energy, solid radiating materials, optical interference filter, and silicon cell in the form of concentric spheres or cylinders which provide maximum energy density and minimum thermal losses. Similarly, also contemplated by this invention is the combination of the interference filter and the silicon cell as an integral unit by applying the interference filter in the form of an optical coating on the surface of the silicon cell.

I wish it to be understood that I do not desire to be limited to the exact details as described, for obvious modifications will occur to a person skilled in the art.

What is claimed is:

1. An energy conversion system for converting thermal radiation energy into electricity comprising in combination;
   - a source of thermal energy and a silicon cell spaced from said thermal energy source;
   - a rare earth oxide radiating solid material positioned between and spaced from said thermal energy source and said silicon cell, said radiating solid material radiating a major portion of the heat received from the thermal energy source in the spectral band where the silicon cell shows its maximum spectral response;

and an interference filter between said radiating solid material and said silicon cell, said interference filter having its maximum reflectivity in the strongest emission band regions of the radiating solid material which are outside the maximum spectral response band of the silicon cell, said interference filter also having its highest transmission in the wavelength range where the silicon cell has good spectral response.

2. An energy conversion system according to claim 1 wherein the source of thermal energy is the heat from the combustion of a fossil fuel.

3. An energy conversion system according to claim 1 wherein the source of thermal energy is the heat from a solid propellant fuel.

4. An energy conversion system according to claim 1 wherein the source of thermal energy is the heat from a radioisotope fuel.

5. An energy conversion system according to claim 1 wherein the radiating solid material is a rare earth oxide selected from the group consisting of ytterbium oxide, erbium oxide, and thulium oxide.

6. An energy conversion system according to claim 1 wherein said radiating solid material is ytterbium oxide.

7. An energy conversion system according to claim 1 wherein said radiating solid material is erbium oxide.

8. An energy conversion system according to claim 1 wherein said radiating solid material is thulium oxide.

9. An energy conversion system according to claim 1 wherein the source of thermal energy is the heat from the combustion of a common fossil fuel and wherein the radiating solid material is a rare earth oxide selected from the group consisting of ytterbium oxide, erbium oxide, and thulium oxide.

10. An energy conversion system according to claim 1 wherein the source of thermal energy is the heat from a solid propellant fuel and wherein the radiating solid material is a rare earth oxide selected from the group consisting of ytterbium oxide, erbium oxide, and thulium oxide.

11. An energy conversion system according to claim 1 wherein the source of thermal energy is the heat from a radioisotope fuel and wherein the radiating solid material is a rare earth oxide selected from the group consisting of ytterbium oxide, erbium oxide, and thulium oxide.

* * * * *